(12) United States Patent
Lien et al.

(10) Patent No.: US 6,211,091 B1
(45) Date of Patent: Apr. 3, 2001

(54) SELF-ALIGNED EETCHING PROCESS

(75) Inventors: Wan-Yih Lien, Hsinchu; Meng-Jaw Cherng, Hsinchu Hsien, both of (TW)

(73) Assignee: Worldwide Semiconductor Mfg. Corp., Hsinchu (TW)

( * ) Notice: Subject to any disclaimer, the term of this patent is extended or adjusted under 35 U.S.C. 154(b) by 0 days.

(21) Appl. No.: 09/373,318

(22) Filed: Aug. 12, 1999

(30) Foreign Application Priority Data

Jun. 9, 1999 (TW) .................................................. 88109594

(51) Int. Cl.$^7$ ................................................. H01L 21/3056
(52) U.S. Cl. .................. 438/706; 438/710; 438/712; 438/713; 438/770
(58) Field of Search .................................... 438/706, 710, 438/712, 252, 253, 254, 255, 256, 257

(56) References Cited

U.S. PATENT DOCUMENTS

| | | | |
|---|---|---|---|
| 4,888,988 | * 12/1989 | Lee et al. | 73/204.26 |
| 5,286,667 | * 2/1994 | Lin et al. | 437/52 |
| 5,706,164 | * 1/1998 | Jeng | 361/321.4 |
| 5,731,236 | * 3/1998 | Chou et al. | 438/253 |
| 5,759,887 | * 6/1998 | Ito et al. | 438/238 |
| 5,763,286 | * 6/1998 | Figura et al. | 437/60 |
| 5,932,901 | * 8/1999 | Itabashi et al. | 257/211 |

* cited by examiner

Primary Examiner—Robert Kunemund
Assistant Examiner—Lan Vinh
(74) Attorney, Agent, or Firm—Jiawei Huang; J C Patents

(57) ABSTRACT

The invention describes a self-aligned etching process. A conductive layer and a first insulating layer are formed on a substrate in sequence, and then the conductive layer and the first insulating layer are patterned to form a plurality of stacks on desired regions. Subsequently, spacers are formed on sidewalls of each stack, and a stop layer is then formed on the substrate. A second insulating layer is formed on the substrate and is planarized. Portions of the second insulating layer are removed to form a plurality of openings and to expose portions of the stop layer located between spacers. The exposed stop layer is removed.

18 Claims, 2 Drawing Sheets

SELF-ALIGNED EETCHING PROCESS

CROSS-REFERENCE TO RELATED APPLICATION

This application claims the priority benefit of Taiwan application serial no. 88109594, filed Jun. 9, 1999.

BACKGROUND OF THE INVENTION

1. Field of the Invention

The present invention relates to a method for fabricating a semiconductor device, and more particularly, to a self-aligned etching process.

2. Description of the Related Art

When the deep sub-micron process is used in semiconductor manufacturing, the size of a device becomes smaller so that the operating speed of the integrated circuit is efficiently enhanced. Regarding semiconductor devices with the same circuit pattern, the operating speed of the circuit depends on the density of interior devices. In the case of the high density of devices, such as a DRAM (Dynamic Random Access Memory), the space between a bit line and a node contact of a capacitor must decrease, and thus the insulation between them becomes a hard-to-solve problem.

One solution is to form a self-aligned contact. A cap and spacers, both made of silicon nitride, are formed on the top and sidewalls of a bit line, and then a silicon oxide layer is formed thereon. Second, due to different chemical properties of silicon nitride and silicon oxide, by selectively etching silicon oxide, the silicon oxide layer is etched in a self-aligned fashion to form a node contact opening between adjacent bit lines. The bit line is protected during etching because of the silicon nitride cap and spacers, which therefore maintain a good insulation between the bit line and the node contact.

However, in the above case, the dielectric constant of silicon nitride is relatively high, about 7 to 8; thus, a higher bit line capacitance arises (because a capacitor comprising the node contact, a dielectric layer and the bit line in sequence is formed) and a severe coupling effect between adjacent bit lines is induced. This situation seriously affects the accuracy of data reading. For example, in the case of a 64 Mbits DRAM, the general selection principal for using a material or a combination of materials as an insulator between adjacent bit lines is that the induced equivalent bit line capacitance of a section having a capacity of 512 bits must be less than 120 fF; i.e., the equivalent bit line capacitance of each bit must be less than 0.23 fF, which can thereby prevent the data address in a memory from being misjudged.

In addition, greater thermal stress exists between silicon nitride and silicon, and exists between silicon nitride and tungsten silicide as well, which increases the difficulty with which the process is controlled.

Therefore, a need exists for a method of forming a node contact in a self-aligned fashion to prevent the above problems.

SUMMARY OF THE INVENTION

In accordance with the above, the invention provides a method of forming a node contact in a self-aligned fashion. A first insulating layer is formed on a substrate, and a plurality of node contact plugs are then formed within the first insulating layer. A second insulating layer, a conductive layer and a third insulating layer are formed on the first insulating layer in sequence. The third insulating layer and the conductive layer are subsequently patterned to form a plurality of bit line stacks on the second insulating layer. A fourth insulating layer corresponding to the second insulating layer is formed over the substrate, and an anisotropic removal process is then performed to remove portions of the fourth and second insulating layers in order to form spacers on sidewalls of the bit line stacks and to expose upper surfaces of the node contact plugs. A stop layer and a planarized fifth insulating layer are formed on the resulting structure. Portions of the fifth insulating layer are removed to form a plurality of openings and to expose portions of the stop layer above the node contact plugs. The exposed stop layer is removed to expose upper surfaces of the node contact plugs, and then a conductive material fills openings to form a plurality of node contacts.

According to the invention, since the materials used as the third and fourth insulating layers in contact with the conductive layer have a low dielectric constant and good thermal stability, the bit line capacitance is reduced and the accuracy of data reading is enhanced. Furthermore, the thermal stress is reduced so that process control is improved. In addition, since the selected material used as the fifth insulating layer is different from that used as the stop layer, a method can be chosen to remove the fifth insulating layer more efficiently than the stop layer; i.e. the removal can be self-aligned.

The invention provides a self-aligned etching method. The method is performed as following. A conductive layer and a first insulating layer are formed on a substrate. The conductive layer and the first insulating layer are patterned to form a plurality of stacks in desired regions. Second, spacers are formed on sidewalls of each stack, and then a stop layer and a planarized second insulating layer are formed on the substrate. Third, the second insulating layer is etched to form a plurality of openings and to expose portions of the stop layer between spacers, and then the exposed stop layer is etched to expose the substrate.

According to the invention, the materials used as the first insulating layer and spacers in contact with the conductive layer have low dielectric constants and good thermal stability in order to prevent parasitic capacitance and thermal stress from arising. Furthermore, the material used as the stop layer is different from that used as the second insulating layer so that the second insulating layer is etched more efficiently than the stop layer and the process therefore is self-aligned.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
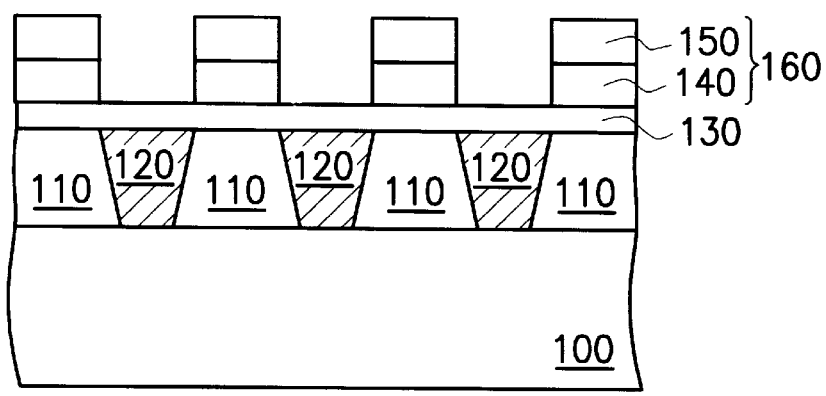
FIG. 1A through FIG. 1E are schematic, cross-sectional views showing a process for forming a node contact in a self-aligned fashion according to one preferred embodiment of this invention.

Referring to FIG. 1A, a first insulating layer 110 is formed on a substrate 100, and a plurality of node contact plugs 120 is then formed within the first insulating layer 110.

A second insulating layer 130 is formed on the first insulating layer 110 by, for example, chemical vapor deposition (CVD) using tetraethyl orthosilicate (TESO) as a gas source. The second insulating layer comprises, for example, silicon oxide.

Subsequently, a conductive layer 140 and a third insulating layer 150 are formed on the second insulating layer 130, and the third insulating layer 150 and the conductive layer 140 are patterned to form a plurality of bit line stacks 160 atop both sides of the node contact plugs 120.

The conductive layer 140 comprises, for example, a doped polysilicon having a thickness of about 500–1000 Å and a tungsten silicide having a thickness of about 1000–2000 Å. The polysilicon is formed by, for example, CVD using silane as a gas source. The tungsten silicide is formed by, for example, CVD using $SiH_4$ and $WF_6$ as a gas source. The third insulating layer 150 comprises, for example, a silicon oxide layer having a thickness of about 2500–3500 Å. The silicon oxide layer is formed by, for example, CVD using TEOS as a gas source.

Figure 1B:
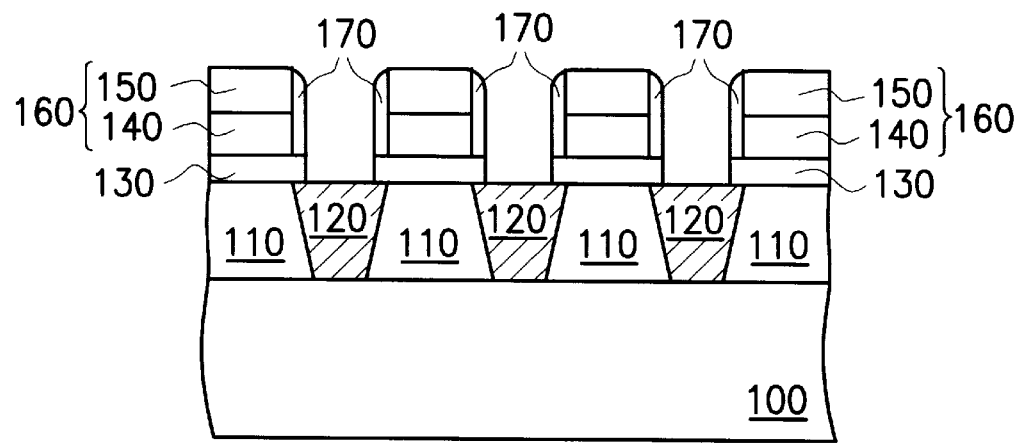

Referring to FIG. 1B, a fourth insulating layer (not shown) is formed on the substrate 100 to a thickness of about 500–1500 Å, and then the fourth insulating layer and the second insulating layer 130 are etched by an anisotropic etching to form spacers 170 on sidewalls of bit line stacks 160 and to expose upper surfaces of node contact plugs 120.

Preferably, the materials used as the fourth (i.e. spacers 170) and the second insulating layers 130 have similar properties, and the best results are obtained when the materials have the same properties. For example, they can be a silicon oxide forming by CVD so that the node contact plug 120 can be exposed by only one etching step.

Figure 1C:
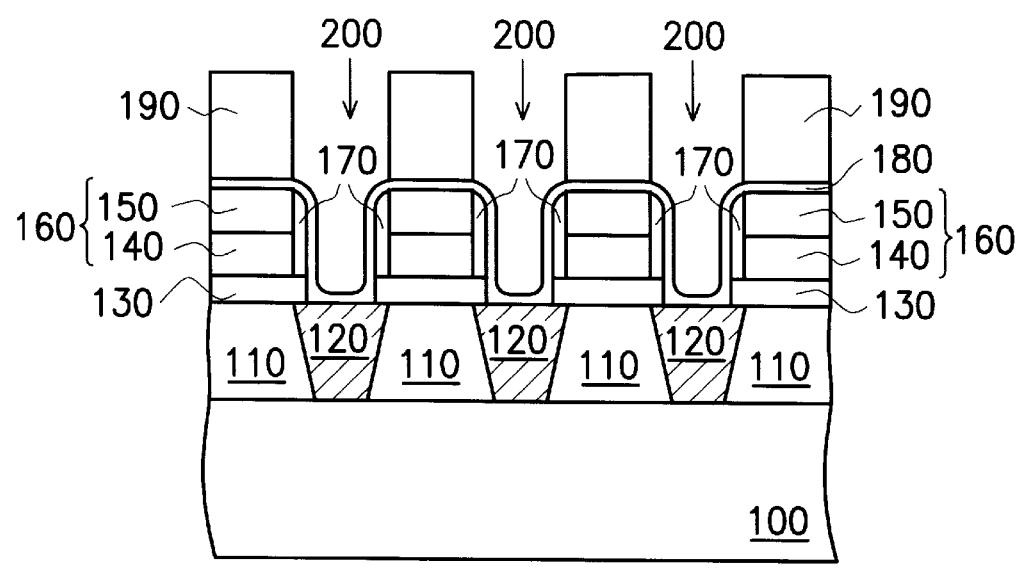

Referring to FIG. 1C, a stop layer 180 is formed on the substrate 100. The stop layer 180 comprises, for example, a silicon nitride having a thickness of about 100–300 Å. The silicon nitride is deposited by, for example, low pressure chemical vapor deposition (LPCVD) using $Si_2H_2Cl_2$ and $NH_3$ as a gas source.

A planarized fifth insulating layer 190 is formed on the stop layer 180 to a thickness of about 3000–6000 Å. The fifth insulating layer 190 comprises, for example, a silicon oxide layer deposited by high density plasma CVD or a borophosphosilicate glass (BPSG) layer deposited by atmospheric CVD.

Portions of the fifth insulating layer 190 are removed to form a plurality of openings 200 and to expose the portions of the stop layer 180 above node contact plugs 120. Preferably, material used as the stop layer 180 is different from the material used as the fifth insulating layer 190. For example, the stop layer 180 is silicon nitride, and the fifth insulating layer 190 is silicon oxide. Thus the fifth insulating layer 190 can be etched by selective etching to form the opening 200, but the stop layer 180 is not etched during selective etching. This process is self-aligned. In the case of reactive ion etching (RIE), the parameters for the selective etching are, for example, a chamber pressure of about 30–50 mTorr, a RF power of about 1200–1800 W, a $C_4F_4$ flow rate of about 5–9 sccm (standard cubic centimeters per minute) and an Ar flow rate of about 400–600 sccm.

Figure 1D:
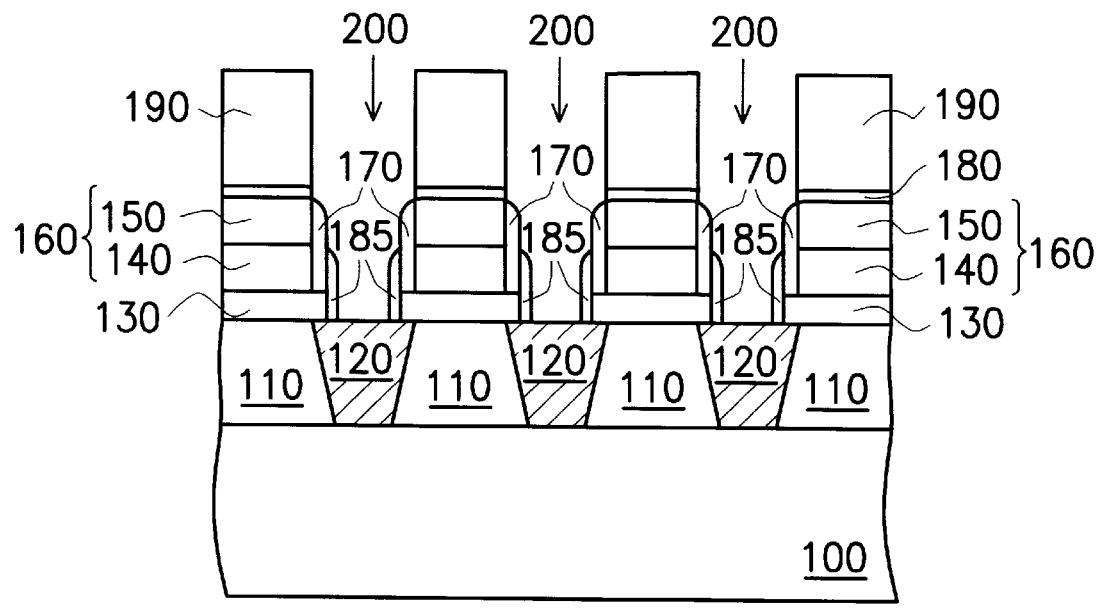

Referring to FIG. 1D, the exposed stop layer 180 is etched. The remainder of stop layer 180 forms spacers 185 and exposes the upper surfaces of the node contact plugs. The method used preferably has better etching selectivity with respect to the stop layer 180 to prevent the third insulating layer 150, spacers 170 and nod contact plugs 120 from being damaged. For example, when the stop layer is silicon nitride, the third insulating layer 150 and spacers 170 are silicon oxide, and node contact plugs 120 are doped polysilicon. In the case of RIE, the related parameters for etching the stop layer 180 are a chamber pressure of about 40–60 mTorr, a RF power of about 150–300 W, a $C_4F_4$ flow rate of about 10–20 sccm and an Ar flow rate of about 30–50 sccm.

Figure 1E:
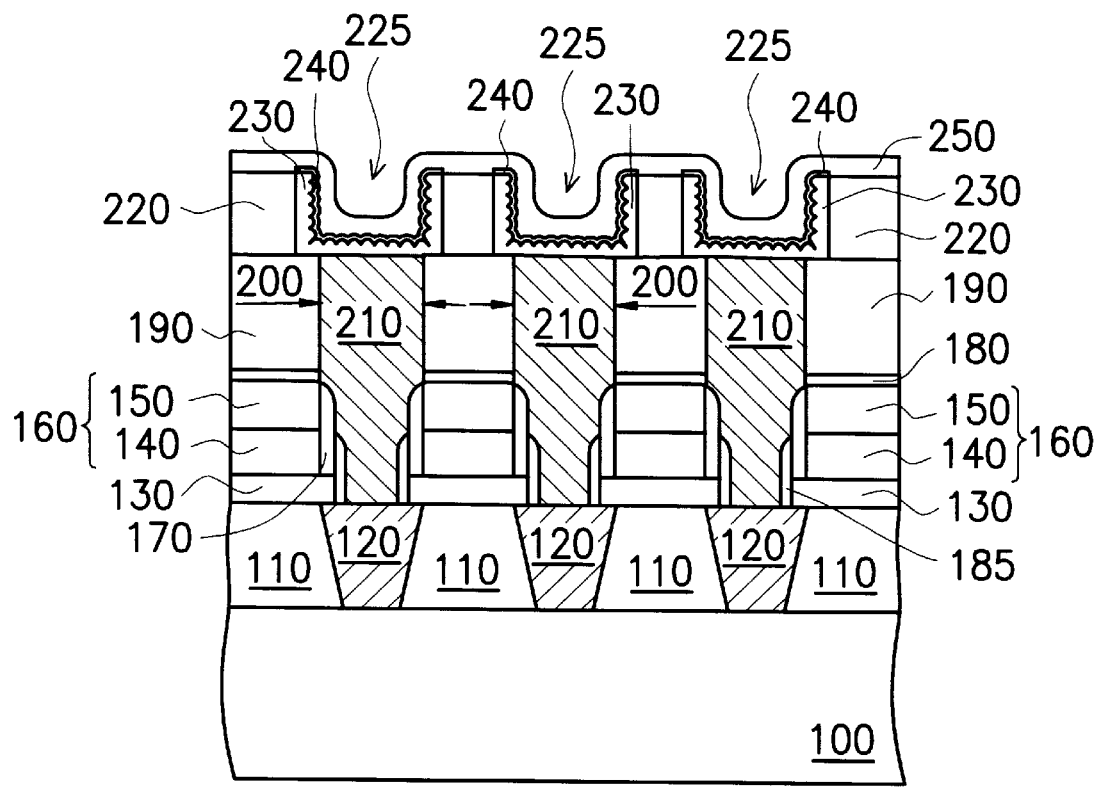

Referring to FIG. 1E, a conductive material fills openings 200 to form node contacts 210. A sixth insulating layer 220 such as a silicon oxide is formed on the resulting structure, and the sixth insulating layer 220 is subsequently etched to form openings 225 and to expose node contacts 210. A conductive layer 230, a dielectric layer 240 and another conductive layer 250 are formed on openings 225 to complete capacitors. The conductive layer 230 is, for example, a doped hemi-spherical grained polysilicon layer. The dielectric layer 240 is, for example, a silicon oxide/silicon nitride/silicon oxide layer. The conductive layer 250 is, for example, a doped polysilicon layer.

In the above embodiment, for example, spacers 170 having a lower dielectric constant comprise silicon oxide. The stop layer 180 uses a different material such as silicon nitride. Therefore, although the stop layer 180 has a higher dielectric constant, the influence of the stop layer 180 on the overall dielectric constant is small because the stop layer 180 is thin and the thickness of the stop layer 180 is further reduced during etching.

With regard to thermal stress, the materials used as the third insulating layer 150 and spacers 170 preferably have good thermal stability. For example, a silicon oxide can be used to reduce the thermal stress during a thermal process and to prevent the conductive line structure from being damaged.

The material used as the fifth insulating layer 150 is different from that used as the stop layer 180. For example, the fifth insulating layer 150 is a silicon oxide and the stop layer 180 is a silicon nitride, so that the self-aligned etching can be efficiently performed.

Although the above embodiment of the invention discloses the related skills for forming a node contact between adjacent bit lines, the invention should not be construed as limited to the embodiment set forth herein. For example, the invention also applies to forming a self-aligned contact between adjacent gate electrodes, and also applies to any process that can be performed to form an opening between adjacent conductive lines in a self-aligned fashion and to reduce coupling capacitance and thermal stress.

According to the preferred embodiment, the invention has the advantages of reducing the coupling capacitance between adjacent conductive lines and decreasing the thermal stress to which the conductive line is subjected, and also is self-aligned.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a node contact in a self-aligned fashion, which applies on a substrate, a first insulating layer is formed; and a plurality of node contact plugs are formed within the first insulating layer, the method comprising:

forming a second insulating layer on the first insulating layer;

forming a conductive layer on the second insulating layer;

forming a third insulating layer on the conductive layer;

patterning the third insulating layer and the conductive layer to form a plurality of bit line stacks;

forming a fourth insulating layer on the substrate, wherein materials used as the fourth and the second insulating layers are similar;

performing a first anisotropic removal process to remove portions of the fourth and second insulating layers so that spacers are formed on the sidewalls of each bit line stack and upper surfaces of the node contact plugs are exposed;

forming a stop layer on the substrate;

forming a planarized fifth insulating layer on the stop layer;

performing a second removal process to remove portions of the fifth insulating layer so that a plurality of openings are formed and upper surfaces of the stop layer above the node contact plugs are exposed;

performing a third removal process to remove exposed portions of the stop layer so that a remaining portion of the stop layer forms second spacers covering a portion of the first spacers and a portion the node contact plugs between the second spacers is exposed; and filling the openings with a conductive material to form a plurality of node contacts.

2. The method according to claim 1, wherein the material used as the second and fourth insulating layers includes a silicon oxide deposited by chemical vapor deposition.

3. The method according to claim 1, wherein the third and fourth insulating layers have a better stability against thermal stress than the stop layer.

4. The method according to claim 1, wherein a dielectric constant of the material used as the fourth insulating layer is lower than that of the material used as the stop layer.

5. The method according to claim 1, wherein the material used as the fourth insulating layer is different from that used as the stop layer.

6. The method according to claim 1, wherein the material used as the stop layer includes a silicon nitride deposited by chemical vapor deposition.

7. The method according to claim 1, wherein an insulating material used as the fifth insulating layer is different from that used as the stop layer.

8. A method for forming a self-aligned contact opening, wherein the method applies to a substrate, the method comprising:

forming a conductive layer on the substrate;

forming a first insulating layer on the conductive layer;

patterning the first insulating layer and the conductive layer to form a plurality of gate electrode stacks on the substrate;

forming a plurality of first spacers on sidewalls of the gate electrode stacks;

forming a conformal stop layer on the substrate;

forming a planarized second insulating layer on the stop layer;

performing a first removal process to remove portions of the second insulating layer so that a plurality of opening are formed and surfaces of the stop layer between adjacent first spacers are exposed; and performing a second removal process to remove exposed portions of the stop layer so that a remaining portions of the stop layer forms second spacers for partially covering the first spacers, the sidewall of the first insulating layer and exposing a portion the node contact plugs between the second spacers.

9. The method according to claim 8, wherein the first insulating layer and the spacers have a better stability against thermal stress than the stop layer.

10. The method according to claim 8, wherein a dielectric constant of a material used as the spacers is lower than that of a material used as the stop layer.

11. The method according to claim 8, wherein the material used as the first insulating layer and the spacers includes a silicon oxide deposited by chemical vapor deposition.

12. The method according to claim 8, wherein the material used as the stop layer includes a silicon nitride deposited by chemical vapor deposition.

13. The method according to claim 8, wherein the material used as the second insulating layer includes a silicon oxide deposited by chemical vapor deposition.

14. The method according to claim 8, wherein, during the first removal process, etching rate of the second insulating layer is higher than the stop layer.

15. A method of a self-aligned etching, the method comprising:

providing a substrate;

forming a conductive layer on the substrate;

forming a first insulating layer on the conductive layer;

patterning the first insulating layer and the conductive layer to form a plurality of stacks on the substrate;

forming first spacers on sidewalls of each stack;

forming a conformal stop layer on the substrate;

forming a planarized second insulating layer on the stop layer;

etching the second insulating layer to form a plurality of openings and to expose a portion of the stop layer between first spacers; and etching the exposed portion of the stop layer, so that a remaining portion of the stop layer forms second spacers covering a portion of the first spacers and a portion the node contact plugs between the second spacers is exposed.

16. The method according to claim 15, wherein the conductive layer comprises of a doped polysilicon layer and a tungsten silicide layer.

17. The method according to claim 15, wherein the first insulating layer and the spacers have a better stability against thermal stress than the stop layer.

18. The method according to claim 15, wherein a dielectric constant of the material used as the spacers is lower than that of the material used as the stop layer.

* * * * *